US007120024B2

(12) United States Patent
Watanabe et al.

(10) Patent No.: US 7,120,024 B2
(45) Date of Patent: Oct. 10, 2006

(54) ELECTRONIC CONTROL DEVICE

(75) Inventors: Hiromichi Watanabe, Kobe (JP); Shinichi Sugiura, Kobe (JP); Takafumi Yasuhara, Kobe (JP); Katsufumi Morimune, Kobe (JP); Hideaki Kaino, Kobe (JP); Nobuhiro Wada, Kobe (JP); Masatsugu Oohara, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 207 days.

(21) Appl. No.: 10/788,897

(22) Filed: Feb. 27, 2004

(65) Prior Publication Data

US 2005/0190539 A1  Sep. 1, 2005

(51) Int. Cl.
*H05K 7/20* (2006.01)
(52) U.S. Cl. ............ 361/704; 361/601; 361/719; 361/720; 174/16.3; 174/252; 211/41.17; 312/223.1; 312/223.2; 165/80.2; 165/185; 439/76.2; 439/76.1
(58) Field of Classification Search ............... 361/704, 361/601, 600
See application file for complete search history.

(56) References Cited

U.S. PATENT DOCUMENTS

| 4,668,873 | A | * | 5/1987 | Ohba et al. ............... 307/9.1 |
| 6,160,708 | A | * | 12/2000 | Loibl et al. .................. 361/704 |
| 2002/0141143 | A1 | * | 10/2002 | Yamane ..................... 361/601 |
| 2002/0154486 | A1 | * | 10/2002 | Koike et al. ................ 361/704 |
| 2003/0048611 | A1 | * | 3/2003 | Skofljanec .................. 361/704 |
| 2003/0133267 | A1 | * | 7/2003 | Beihoff et al. ............. 361/704 |
| 2004/0141292 | A1 | * | 7/2004 | Onizuka et al. ............ 361/704 |

FOREIGN PATENT DOCUMENTS

| JP | 7-297561 | 11/1995 |
| JP | 2000-323848 | 11/2000 |

OTHER PUBLICATIONS

Patent Abstracts of Japan for Publication No. 07297561, Publication Date Nov. 10, 1995.
Patent Abstracts of Japan for Publication No. 2000323848, Publication Date Nov. 24, 2000.

* cited by examiner

*Primary Examiner*—Lynn Feild
*Assistant Examiner*—Biju Chandran
(74) *Attorney, Agent, or Firm*—Christie, Parker & Hale, LLP

(57) ABSTRACT

An electronic control device enabling heat generated by a power module to be favorably radiated even in a high-temperature condition in an engine compartment. The unit includes a casing accommodating a control circuit substrate; a die-cast mounting plate forming a control circuit substrate support portion, a frame-like fitting member and an external mounting portion integrally together; and a metal substrate on which a power module is adhered. When the mounting plate is mounted on the wall of a transmission and the metal substrate is fitted in the opening in the bottom surface of the frame-like fitting member, a mounting surface in nearly the same plane is formed by the lower surface of the mounting plate and by the lower surface of the metal substrate permitting heat from the power module to be radiated to the wall.

23 Claims, 7 Drawing Sheets

ELECTRONIC CONTROL DEVICE

BACKGROUND OF THE INVENTION

1. Field of the Invention

The present invention relates to an electronic control device mounted on a vehicle such as an automobile and, specifically, to an electronic control device used in a high-temperature environment. More particularly, the invention relates to an electronic control device which favorably radiates heat generated by a control circuit board and a power module even in a high-temperature environment such as in an engine compartment.

2. Description of the Related Art

A plurality of electronic control devices have heretofore been mounted as a single unit on a vehicle such as an automobile to individually control the installed devices such as engine and the like. Each electronic control device comprises a control circuit unit including a microcomputer which executes logical control operations based upon the electronic data detected by the sensors, and a drive circuit unit which controls an electric power supply to external units such as actuators that drive the objects to be controlled relying upon the results an operation.

Japanese Unexamined Patent Publication (Kokai) No. 2000-323848 discloses an electronic control device that has been used. In this electronic control device, a major portion working as the electronic control device 1 is accommodated in a connector-integrated resin casing 2 with which a connector casing is integrally molded. A data-receiving connector and a power supply connector are disposed by being grouped into one on the side surface of the connector-integrated resin casing 2. This enables the electric connection between the electronic control device and the external electronic part to be accomplished from one side of the unit.

In the electronic control device of this constitution, the connector-integrated resin casing assumes a complex structure which is difficult to mold and assemble. In particular, as the connectors become large and the number of storage units increases, it becomes difficult to arrange the connectors on the same side surface of the connector-integrated resin casing 2. Such an electronic control unit effects the electric connection to an external unit via a wire harness. However, if the connectors are not mounted on the same side surface, it becomes difficult to lay the harness which requires an increased space for mounting. Besides, the cost of production is driven up due to the use of water-proof packings between the resin casing and the closure, and between the resin casing and the heat sink.

Further, Japanese Unexamined Patent Publication (Kokai) No. 7-297561 discloses a prior art related to an electronic equipment housing in which a control circuit unit, a drive circuit unit and a power circuit unit are formed in separate spaces. The power circuit unit is provided with heat-radiating fins to prevent a rise in the temperature in the housing of the electronic equipment. In the drive circuit unit and the power circuit unit, the circuit constituent elements that produce and receive signals are arranged at positions close to each other so as to accomplish a direct electric connection. Here, the electric connection between the drive circuit unit and the control circuit unit is accomplished by using a set of connectors, and the control circuit unit is combined with the power circuit unit that includes the drive circuit unit.

According to the electronic equipment housing of the constitution disclosed in Japanese Unexamined Patent Publication (Kokai) No. 7-297561, the control circuit portion, drive circuit unit and power circuit unit are connected by using connectors. Therefore, parts of the circuit units must be electrically connected to the connectors, and a large amount of wiring must be laid between the circuit units.

Therefore, the above Japanese Unexamined Patent Publication (Kokai) No. 2000-323848 discloses the structure of a combination of an electronic control device that is so improved as can be easily assembled as an electronic equipment. In this electronic control device, the control circuit unit and the power circuit unit are separated from each other. In the control circuit unit, a control circuit substrate is formed being mounted in the control connector-integrated casing with which a data-receiving connector is integrally molded. In the power circuit unit, a heat sink mounting the power control element is mounted on the lower surface of the power supply connector-integrated casing with which a power supply connector is integrally molded. An intermediate layer having relay connection terminals is arranged between the control circuit unit and the power circuit unit, and the connection terminals of the control circuit unit are electrically connected to the connection terminals of the power circuit unit through the relay connection terminals.

In the above electronic control device, the data-receiving connector-integrated casing, power supply connector-integrated casing and heat sink are stacked and adhered to each other and, besides, a closure is mounted on the uppermost portion thereof. Therefore, the electronic control device, as a whole, assumes a three-stage-overlapped constitution.

In the electronic equipment equipped with the power part as described above, the power control element itself generates heat. Therefore, a heat-radiating measure is necessarily taken so that the electronic part will not be damaged by heat. The above electronic control device is equipped with a heat sink to radiate heat generated by the power control element.

The electronic control devices used for a vehicle for controlling the operations of the engines and the like are usually mounted in the engine compartment of the vehicle or are integrally mounted on the actuator. The place of mounting is in a high-temperature environment which is severe. In order to maintain reliability in such an environment, a heat-resistant ceramic substrate is used for forming electronic circuitry for the electronic control.

The ceramic substrate is produced being fired at a high temperature. The size of the work cannot be increased. Therefore, the cost of production becomes high. In order not to use the ceramic substrate, therefore, it becomes necessary to produce a substrate made of a heat-resistant resin of a low cost which can be used in a high-temperature environment to lower the cost of the electronic control unit.

It is, further, a modern trend to so design the automobile as to expand the passenger compartment as much as possible to offer only a very limited space for the engine room. If it is attempted to mount an electronic control unit in such a limited space, consideration must be given to radiating the heat from the electronic parts inclusive of the power control element so as to be used in a high-temperature environment. Besides, since only limited space is available for installing electronic equipment, there is no means to realize the electronic control unit itself in a small size.

In the above-mentioned electronic control device, the fins of the heat sink are lengthened to enhance the heat-radiating efficiency of the electronic parts. This, however, results in an increase in the size of the unit which is against the requirement for decreasing the size. The conventional electronic control device has a connector-integrated casing of a large thickness and, further, requires a heat sink. The electronic control device is too bulky to be mounted in a narrow space such as in an engine compartment.

In order to decrease the size of the electronic control device, therefore, a contrivance is necessary for decreasing the thickness of the connector-integrated casing. Here, if it is attempted not to use the heat sink which is a cause of making the device bulky, it becomes necessary to further increase the heat-radiating efficiency for the electronic parts in a high-temperature environment. Besides, the electronic control device mounted on a vehicle such as an automobile must be so constituted as will not to be detached or as will not to develop defect in the connection despite of receiving vibration while the vehicle is traveling.

It is therefore an object of the present invention to provide an electronic control device which is small in size, efficiently radiates heat and is easily installed even in a narrow space in high-temperature conditions in an engine compartment.

SUMMARY OF THE INVENTION

In order to solve the above-mentioned problems according to the present invention, an electronic control device that can be mounted on an external heat radiating member comprises a casing containing therein a control circuit substrate forming an electronic circuit inclusive of electronic parts and having connectors for external connection on one side wall thereof, a metallic mounting plate having, while integrally formed together therewith, an external mounting portion and a frame-like fitting portion in which a plurality of support portions for supporting the control circuit substrate are erected surrounding the opening in the bottom surface, and a power circuit substrate which includes a metallic substrate and is fitted to the opening in the bottom surface, forming a power circuit inclusive of a power control element electrically connected to the electronic circuit, and exposing the lower surface of the metallic substrate.

When the power circuit substrate is fitted to the opening in the bottom surface, there is formed a mounting surface where the mounting portion, the frame-like fitting member, and the lower surface of the power circuit substrate are on the same plane. The mounting plate is mounted on an external heat-absorbing member by the external mounting portion, and the mounting surface is brought into contact with the surface of the external heat-absorbing member.

The control circuit substrate is a heat-resistant resin substrate, a space is formed by the support portion relative to the power substrate, the electronic parts are connected to the lower surface of the control circuit substrate, and a heat-radiating portion is provided in the space to radiate the heat of the electronic parts to the mounting plate.

The heat-radiating portion is made of a metal plate which is supported by the support portion so as to come into contact with the electronic part.

The heat-radiating portion may have a belt-like heat conducting member arranged in the space, the belt-like heat conducting member being continuously formed integrally with the frame-like fitting member so as to come in contact with the electronic parts. A heat conducting and elastic adhesive layer is interposed between the electronic parts and the belt-like heat conducting member. Further, the belt-like heat conducting member has a recessed portion for accommodating the electronic parts, and the recessed portion is filled with a heat conducting gelatinous material.

Further, the ends of a plurality of lead conductors extending from the connector for external connection and the ends of a plurality of lead conductors extending from the power circuit substrate, protrude beyond the side surface opposite to the power circuit substrate through the lead conductor holes formed in the control circuit substrate so as to be connected to the electronic circuit formed on the control circuit substrate.

A socket or a plug connected to the power circuit is disposed on the upper surface of the power circuit substrate, and a plug or a socket to be connected to the electronic circuit is disposed on the lower surface of the control circuit substrate while being engaged with the socket or the plug. The socket and the plug have surface contact portions that slide in one direction relative to each other.

The power circuit substrate is fitted to the frame-like fitting member in the inner peripheral portion of the opening in the bottom surface by using a heat conducting and adhesive adhesive. The external mounting portion has a fastening portion for fastening and securing the external heat-absorbing member. The fastening portion has at least two protruding portions integrally formed with the mounting plate in a direction at right angles with the mounting surface, and tightening screws that fit to the protruding portions.

The power circuit substrate has engaging protrusions corresponding to engaging recessed portions formed in the surface of the external heat-absorbing member, and the engaging recessed portions and the engaging protrusions are press-contacted in the direction of the mounting surface due to the fastening force produced by the fastening screws. The power circuit substrate may have a threaded engaging portion that protrudes from the bottom surface of the substrate, and the threaded engaging portion is screwed into the external heat-absorbing member so that the power circiut substrate is intimately adhered onto the external heat-absorbing member.

Further, the power circuit substrate is screwed into the external heat-absorbing member with a highly heat conducting elastic layer interposed therebetween, or is secured upon coming into contact with a plurality of protrusions formed on the surface of the external heat-absorbing member. Or, the power circuit substrate is secured to the external heat-absorbing member via heat conducting elastic balls arranged in a groove formed in the external heat-absorbing member.

The external heat-absorbing member is a wall of a transmission housing of an automobile, and the power circuit substrate is cooled by a lubricating oil in the transmission housing of the automobile.

The thus constituted electronic control device can be easily assembled in a small size, and efficiently radiates the heat generated in the device, lending itself well for being easily installed even in a high-temperature environment such as in an engine compartment of an automobile and even in a narrow space.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DESCRIPTION OF THE PREFERRED EMBODIMENTS

An embodiment of the electronic control device according to the invention will now be described with reference to the drawings. Before describing the electronic control device of this embodiment, however, described below is an electronic control device according to a prior art on which the electronic control device of this embodiment is based to clarify the feature and effect of this embodiment.

Figure 16:
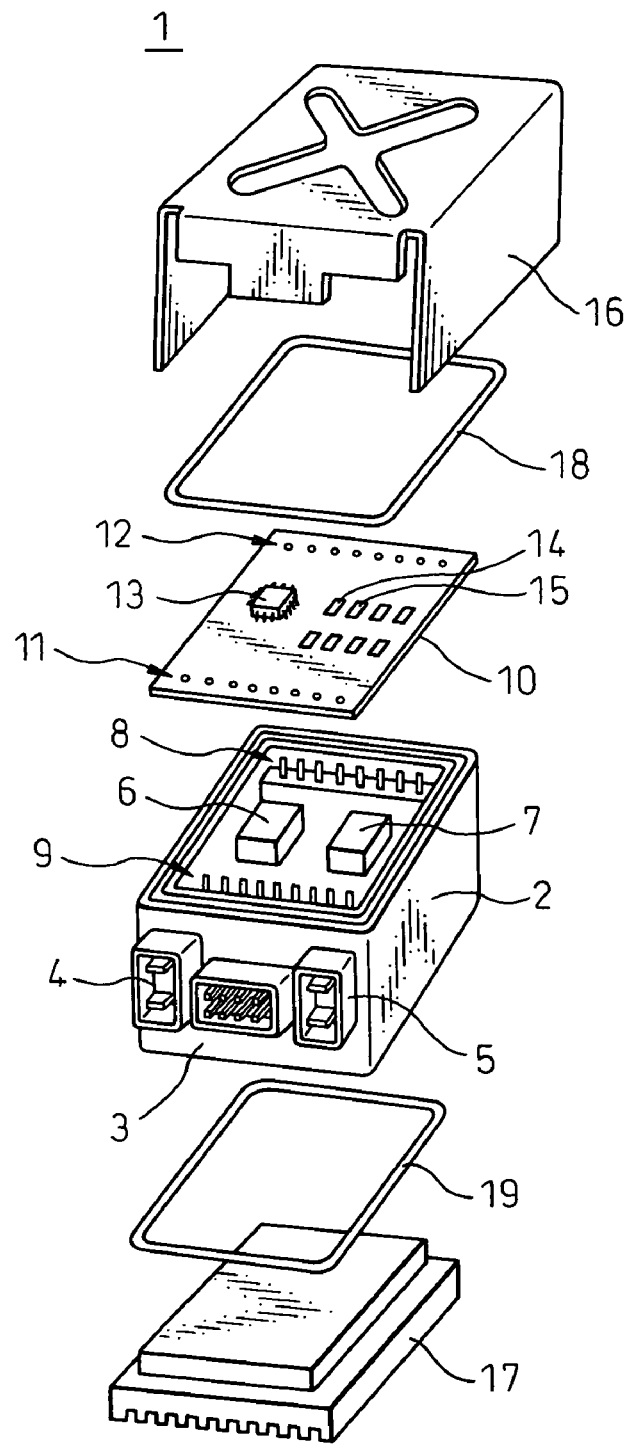
FIG. 16 is a disassembled perspective view illustrating the constitution of a combination of a conventional electronic control device.

FIG. 16 schematically illustrates the constitution of an electronic control device disclosed in Japanese Unexamined Patent Publication (Kokai) No. 2001-323848.

A major portion working as an electronic control device 1 is accommodated in a connector-integrated resin casing 2 with which a connector casing is integrally formed. A data-receiving connector 3 and power supply connectors 4, 5 are provided being grouped into one on the side surface of the connector-integrated resin casing 2. Therefore, the electric connection of the electronic control device 1 to an external unit is accomplished from one direction only.

The connector-integrated resin casing 2 accommodates a control circuit unit and a drive circuit unit. The drive circuit unit includes a plurality of power control elements 6 and 7, and on which are mounted connection terminals 8 and 9. The connection terminals 8 and 9 are used for electric connection to a control circuit substrate 10 included in the control circuit unit. Here, the control circuit substrate 10 is mounted on the upper surface side of the connector-integrated resin casing 2. A plurality of through holes 11, 12 are formed in end portions of the substrate 10. The connection terminals 8 and 9 are inserted in the through holes 11 and 12, and the control circuit and the drive circuit are electrically connected together by soldering. A plurality of electronic control parts 13, 14, 15 are mounted on the control circuit substrate 10. The control circuit substrate 10 is mounted on the upper side of the connector-integrated resin casing 2 and, then, a closure 16 is placed thereon. On the bottom surface side of the connector-integrated resin casing 2, there is mounted a heat sink 17 for cooling the heat generated by the power control elements 6 and 7 in the drive circuit. Water-proof packings 18 and 19 are interposed in the junction portions among the closure 16, the heat sink 17 and the connector-integrated resin casing 2.

In the illustrated electronic control device as described above, the data-receiving connector-integrated casing, power supplying connector-integrated casing and heat sink are stacked one upon the other and are adhered together. Then, a closure is mounted on the uppermost portion thereof to form a three-stage-overlapped constitution. In order to facilitate the electric connection in the unit, therefore, there is arranged an intermediate layer equipped with relay connection terminals. Namely, the connectors for connection to external units are grouped on one side surface of the casing to suppress the size of the unit as a whole, enabling the device to be simply assembled. However, the simplification of the assembling operation is accompanied by an increase in the number of parts and does not contribute to lowering the cost. Besides, the size of the device is not still sufficiently decreased to cope with the installation of the device in a narrow space.

Further, the conventional electronic control device is provided with the heat sink for removing the heat generated by the electronic parts themselves. To effectively remove the heat, however, the heat-radiating area of the heat sink must be increased from the standpoint of resistance of the electronic parts against the temperature. For this purpose, the cooling fins of the heat sink must be lengthened. This, however, results in an increase in the size of the electronic control device equipped with the heat sink, and makes it difficult to install the electronic control device in a high-temperature environment in a narrow engine compartment.

Therefore, the electronic control device of this embodiment does not employ the heat sink which imposes the greatest problem in decreasing the size of the unit as a whole. Instead, heat generated from the power control elements in the electronic control device is directly radiated to the wall of the housing such as of the transmission of which the temperature is controlled to be constant. Heat generated by the electronic parts included in the control circuit, too, is directly radiated to the wall of the housing through the heat conducting member.

In order to greatly decrease the height or thickness of the casing of the electronic control unit, the control circuit substrate forming a control circuit and the power circuit substrate forming a drive circuit are supported in a casing in which the data-receiving connector and the power supplying connector are formed on one side surface thereof, in a manner that the surfaces of the control circuit substrate and of the power circuit substrate are arranged in parallel and opposed to each other, and the electric connection between the control circuit and the drive circuit is directly accomplished by using lead conductors and, besides, the electric connection between the control circuit, drive circuit, data-receiving connector and power supplying connector is directly accomplished by using the lead conductors. This constitution makes it possible to greatly decrease the height or thickness of the casing of the electronic control device.

Further, the electric connection to the circuits or to the connectors through the lead conductors is accomplished in a concentrated manner on the upper surface of the control circuit substrate arranged on the casing through one time of connection operation improving the operation efficiency and decreasing the cost.

Figure 1:
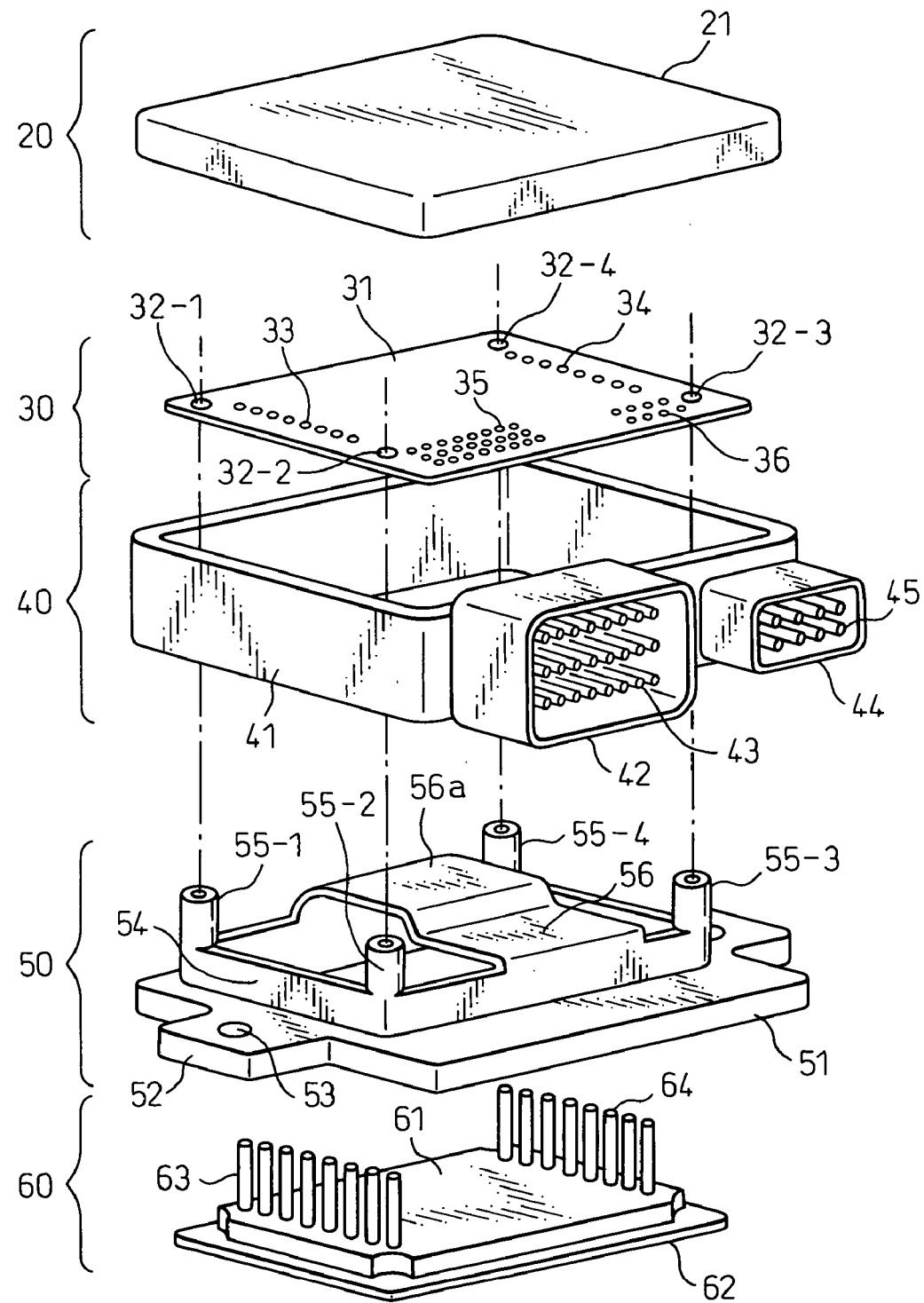
FIG. 1 is a disassembled perspective view illustrating the constitution of a combination in an electronic control device according to an embodiment.

Next, described below with reference to the drawings is an embodiment of the electronic control device of the present invention. FIG. 1 is a disassembled perspective view schematically illustrating the constitution of a whole combination in an electronic control device according to an embodiment.

In FIG. 1, the electronic control unit of this embodiment comprises, from the upper side, a closure portion 20, a control circuit portion 30, a casing portion 40, a mounting portion 50 and a power circuit portion 60. The closure portion 20 is a closure member 21 made of a highly heat-resistant resin, and is stuck to the upper surface of the casing portion 40 after the unit is assembled.

The control circuit portion 30 comprises a control circuit substrate 31. Though not illustrated, the control circuit substrate 31 has a printed wiring for control circuit formed on the upper surface thereof, and has electronic parts forming the control circuit mounted on the lower surface thereof which is the back surface. Holes 33 to 36 for lead conductors are arranged in the peripheral portions of the control circuit substrate 31. Lead conductors are inserted in a plurality of holes 33 to 36 from the lower surface side of the control circuit substrate 31 to the upper surface side thereof, and the lead conductors slightly protruded beyond the upper surface thereof are electrically connected to the conductors of the printed wiring formed on the upper surface of the control circuit substrate 31.

In the control circuit substrate 31, there are formed mounting holes 32-1 to 32-4 in which screws are inserted and secured so as to be supported at a predetermined height in the casing portion 30. The positions of the holes correspond to the positions of the support members of the control circuit substrate 31 in the mounting portion 50, and their number is not limited to four.

The casing portion 40 accommodates the control circuit substrate 31, and comprises a casing body 41 forming the data-receiving connector and the power supplying connector integrally molded on one side surface thereof by using a highly heat-resistant resin. The casing body 41 has a predetermined thickness, assumes a box-like shape with its upper side and lower side being opened, and has a control connector including a data-receiving connector casing 42 and data-receiving connector terminals 43 as well as a power supply connector including a power supply connector casing 44 and power supply connector terminals 45, which are integrally formed on one side wall thereof.

Here, though not illustrated, a plurality of lead conductors are connected to the data-receiving connector terminals 43 and to the power supply connector terminals 44, the plurality of lead conductors being electrically connected to the control circuit and to the output circuit formed on the control circuit substrate 31. The lead conductors are inserted through the lead conductor holes 35 and 36 arranged from the lower side of the control circuit substrate 31, and are electrically connected at their protruded portions to the control circuit.

The mounting portion 50 constitutes a basic plate for mounting the electronic control device on the outer wall of the transmission housing, holds the casing portion 40 and the power circuit portion 60, and supports the control circuit portion 30. The mounting portion 50 as a whole is integrally molded by die-casting an aluminum alloy which favorably conducts heat.

The mounting portion 50 has a mounting plate 51 that serves as a center of the plate, has mounting protrusions 52 on the opposing side portions of the mounting plate 51, and has mounting holes 53 perforated in the mounting protrusions 52 for being mounted on the outer wall of the transmission by screws. A square frame member 54 is formed by four walls rising from the mounting plate 51 at right angles thereto so as to form space that is opened in a square shape leaving the peripheral portions of the mounting plate 51.

Support members 55-1 to 55-4 are erected at four corners of the square frame member 54 being formed integrally with the square frame member 54 and the mounting plate 51 so as to support the control circuit substrate 31 at a predetermined height in the casing unit 40. A belt like heat-conducting member 56 having a suitable width is integrally formed across a pair of walls of the square frame member 54, i.e., crossing the upper edges of the two walls. The belt like heat-conducting member 56 is brought into contact with the surfaces of those electronic parts from which heat must be radiated, the electronic parts being mounted on the lower surface of the control circuit substrate 31. Thus, heat from the electronic parts is absorbed and is radiated through the mounting plate 51. The belt like heat-conducting member 56 may be provided with a belt like heat-conducting contact member 56a which is elevated by a step, if it is convenient for being contacted to the electronic parts.

Next, the power circuit unit 60 comprises a power module 61 in which a power control element forming a drive circuit is sealed with a highly heat-resistant resin, and a metal substrate 62 made of aluminum or the like. The power module 61 and the metal substrate 62 are adhered together with a heat-conducting adhesive. In the power module 61, a plurality of lead conductors 63 and 64 are buried upright for electrically connecting the power control elements contained therein to the control circuit formed in the control circuit substrate 31, or for producing outputs to the actuators.

The thus constituted power circuit portion 60 is so assembled that the lower surface of the outer side of the metal substrate 62 is in flush with the mounting surface of the mounting plate 51. Namely, the power module 61 is arranged on the inside of the opening on the lower side of the square frame member 54 formed on the mounting plate 51. The outer periphery of the metal substrate 62 is brought into engagement with the inner peripheral edge portion of the opening of the square frame member 54, and the metal substrate 62 is brought to be in flush with the mounting plate 51, to obtain the same contact plane as the wall of the transmission.

The lead conductors 63 and 64 buried in the power module 61 are so arranged as will not come in contact with the belt like heat-conducting member 56 when the power circuit portion 60 is incorporated in the mounting plate 51. As shown, the lead conductors 63 and 64 pass through space where there is no belt like heat-conducting member 56. In the control circuit substrate 31, too, the holes 33 and 34 for the lead conductors are formed to meet the above arrangement positions.

As described above, the closure portion 20, control circuit portion 30, casing portion 40, mounting portion 50 and power circuit portion 60 are constituted, respectively, and are successively assembled from the lower side to assemble an electronic control device. First, the power module 61 in which the lead conductors 63 and 64 are buried, and the metal substrate 62 are adhered together, and are attached to the lower surface of the mounting plate 51. Then, the casing portion 40 is mounted on the peripheral edge portions of the mounting plate 51, so that the support members 55-1 to 55-4 and the square frame member 54 are contained therein.

Next, to mount the control circuit substrate 31, the plurality of lead conductors 63 and 64 from the power portion 60 and the plurality of lead conductors extending from the control connector terminals 43 and from the power connector terminals 44, are inserted in the lead conductor holes 33, 34, 35 and 36 formed in the control circuit substrate 31. Then, the control circuit substrate 31 is mounted on the support members 55-1 to 55-4 using screws.

Here, the control circuit substrate 31 is mounted on the mounting plate 51 via support members, i.e., accommodated in the casing portion 40. The control circuit formed on the control circuit substrate 31 and the power circuit formed in the power module 61, are in a state of being electrically connected together through one time of operation and, further, the control circuit and the output circuit formed on the control circuit substrate 31 are in a state of being electrically connected to the connector terminals 43 and 45 through one operation via the lead conductors on the upper surface of the control circuit substrate 31. Besides, the electronic control device is realized in a small size and the assembling is simplified.

As described above, the portions to be electrically connected are concentrated on one side surface of the control circuit substrate 31, and the ends of the lead conductors are protruding beyond the surface of the control circuit substrate 31. Accordingly, the lead conductors are electrically connected to the circuits by soldering or by press-fitting to facilitate the junction. Relying upon this constitution, the connection is accomplished at one time.

After the electric connection has been accomplished, the periphery of the closure 21 is adhered to the periphery on the upper side of the casing portion 40 so as to accommodate the control circuit substrate 31 therein. Thus, the body of the electronic control device is completed. When the wall of the transmission is selected as a member for radiating the heat that is generated by the electronic control device, threaded holes for mounting are perforated in advance in the wall of the transmission, and the mounting plate 51 of the electronic control device is secured by screws by utilizing the above threaded holes. In this case, the metal substrate 62 of the electronic control device remains engaged in the mounting plate 51, and the lower surface of the mounting plate 51 is flush with the surface that is formed. Namely, the metal substrate 62 comes in plane contact with the wall of the transmission to realize efficient heat radiation. Even in a high-temperature environment, therefore, the temperature in the electronic control device can be suppressed to become equal to the controlled temperature of the transmission.

In the foregoing was described the whole constitution of the electronic control device of this embodiment. Next, described below in detail is a portion that constitutes the electronic control device of this embodiment.

[Electric Connection to the Control Circuit Substrate by Lead Conductors]

Figure 2:
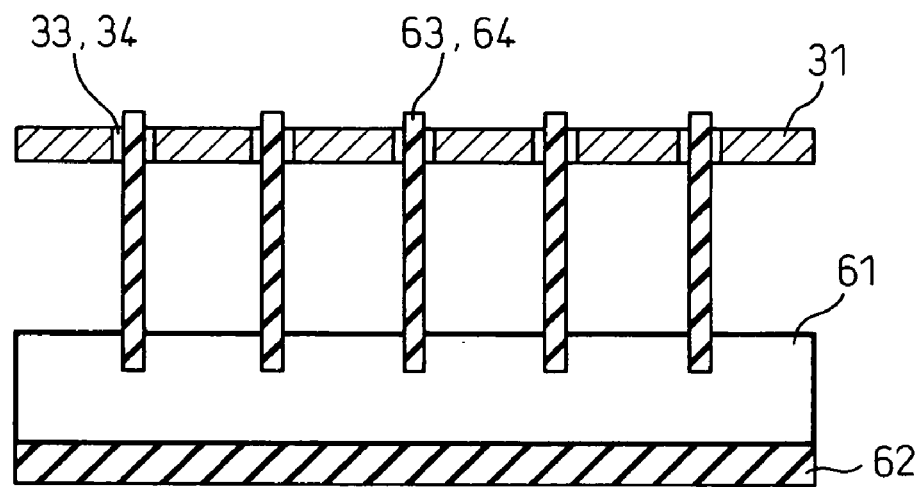
FIG. 2 is a view illustrating a concrete example of electric connection between a power control module and a control circuit substrate in the electronic control device.

FIG. 2 schematically illustrates an electric connection between the control circuit substrate 31 and the power module 61. As described above, the power module 61 is adhered onto the metal substrate 62, and in which the lead conductors 63 and 64 are buried for electric connection to the control circuit formed on the control circuit substrate 31. In the control circuit substrate 31, on the other hand, there are formed lead conductor holes 33 and 34 being corresponded to the positions of the lead conductors 63 and 64.

In positioning the mounting holes 32-1 to 32-4 of the control circuit substrate 31 to the support members 55-1 to 55-4 of the mounting plate 51 at the time of assembling the electronic control device, the lead conductors 63 and 64 are inserted in the lead conductor holes 33 and 34 of the control circuit substrate 31. The lengths of the lead conductors 63 and 64 are so adjusted in advance that their ends protrude beyond the control circuit substrate 31 when the control circuit substrate 31 is secured by screws onto the support members 55-1 to 55-4. The lead conductors 63 and 64 are electrically connected to the control circuit by soldering based on spot flow or by press-fitting.

Here, the lead conductors 63 and 64 illustrated in FIG. 2 are in the form of rods. In assembling the electronic control device, therefore, the ends of the lead conductors 63 and 64 are all inserted in the lead conductor holes 33 and 34 formed in the control circuit substrate 31 requiring a clumsy operation which is in efficient.

Figure 3:
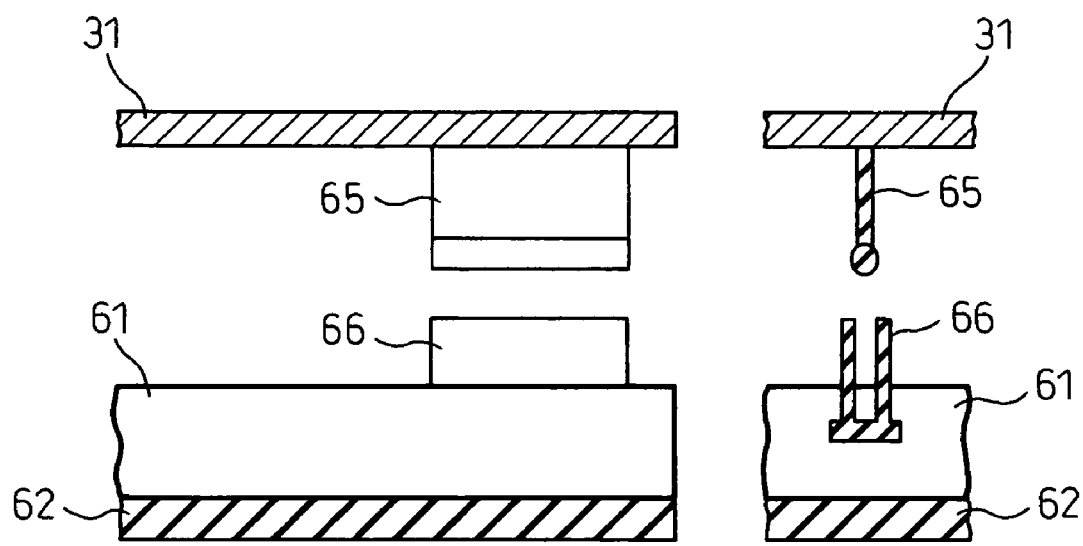
FIG. 3 is a view illustrating another concrete example of electric connection between the power control module and the control circuit substrate in the electronic control device.

Instead of the rod-like conductors, therefore, there can be employed an electric connection of the board-to-board type by which the contact is accomplished on a plane. FIG. 3(*a*) illustrates a state as viewed from the side of the connectors in FIG. 1, and FIG. 3(*b*) is a sectional view thereof. In this case, though there is no need of forming the lead conductor holes 33 and 34 in the control circuit substrate 31, there are arranged, in parallel therewith, board-to-board conductors 65 of a number same as that of the lead conductors that have been connected to the control circuit in advance. In the power module 61, there are buried board-to-board conductors 66 instead of the lead conductors 63, 64. Either the board-to-board conductors 65 or the board-to-board conductors 66 serve as a plug or a socket, and the other side serves as the socket or the plug.

In assembling the electronic control device, the board-to-board conductors 65 and 66 are connected while being slid in the direction of the board and are, hence, positioned easily and reliably. When the board-to-board conductors are employed, the number of parts increases as compared to when the lead conductors are used and the cost increases to some extent preventing, however, incorrect connection, improving the working efficiency, exhibiting increased resistance against vigorous vibration when mounted on an automobile and without developing a defect in the electric connection.

Figure 4:
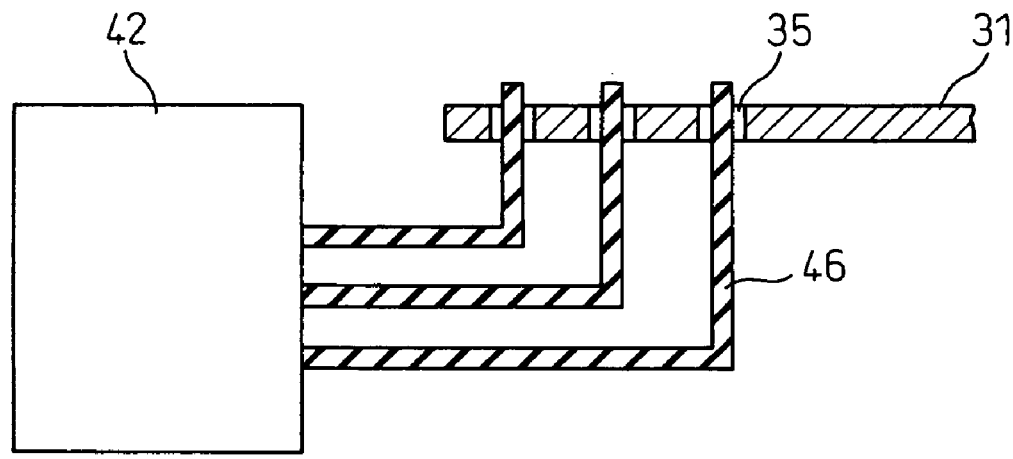
FIG. 4 is a view illustrating a state of electrically connecting a power supplying connector to the control circuit substrate in the electronic control device.

The electric connections in the electronic control device include the one between the electronic circuit formed on the control circuit substrate 31 and the power module 61, as well as the one among the electronic circuit on the control circuit substrate 31, control connector terminals 43 and power connector terminals 45. FIG. 4 illustrates the electric connection among the electronic circuit on the control circuit substrate 31 and the connector terminals.

FIG. 4 illustrates a case when the electric connection between the control circuit formed on the control circuit substrate 31 and the data-receiving connector terminals 43 is viewed from the lateral direction. In FIG. 4, the data-receiving connector terminals 43 are in the connector casing 42 and are concealed by the casing. Lead conductors 46 are connected from the data-receiving connector terminals 43 to the terminals. The lead conductors 46 extend horizontally from the data-receiving connector and rise upward at portions corresponding to the positions of the lead conductor holes 35 in the control circuit substrate 31.

The lead conductors of the rising portions have a length which is so adjusted that the ends of the lead conductors 46 protrude beyond the surface of the control circuit substrate 31 when the lead conductors 46 are inserted in the lead conductor holes 35 of the control circuit substrate 31. The electric connection between the lead conductors 46 and the control circuit is accomplished by the same procedure as the electric connection between the lead conductors 63, 64 and the electronic circuit of the control circuit substrate 31, and at the same time as the above connection.

When the casing body 41 is formed, the lead conductors 46 are formed integrally therewith as the data-receiving connector together with the data-receiving connector terminals 43. Described above was the case of the lead conductors 46 being continuous to the control connector terminals 43. Further, the electric connection between the power supply connector terminals 45 and the electronic circuit on the control circuit substrate 31, too, is accomplished relying upon basically the same constitution as the lead conductors 46 continuous to the data-receiving connector terminals 43. The only difference in the constitution is that, in the case of the power circuit unit, the lead conductors have a larger thickness than that of the control circuit unit.

Mounting the electronic control device on the wall of the transmission.

As described earlier, the electronic control device is mounted being contacted to the outer wall of the transmission of which the temperature is controlled to remain constant by circulating oil, so that the heat generated by the unit is efficiently radiated in a high-temperature environment.

The electronic control device is mounted on the wall of the transmission by using the mounting plate 51 which is a medium for conducting the heat in the device as illustrated in FIG. 1. The state of mounting is illustrated in cross section in FIG. 5 wherein the same portions as those of FIG. 1 are denoted by the same reference numerals. The lead conductors and the electronic parts are not illustrated here.

Figure 5:
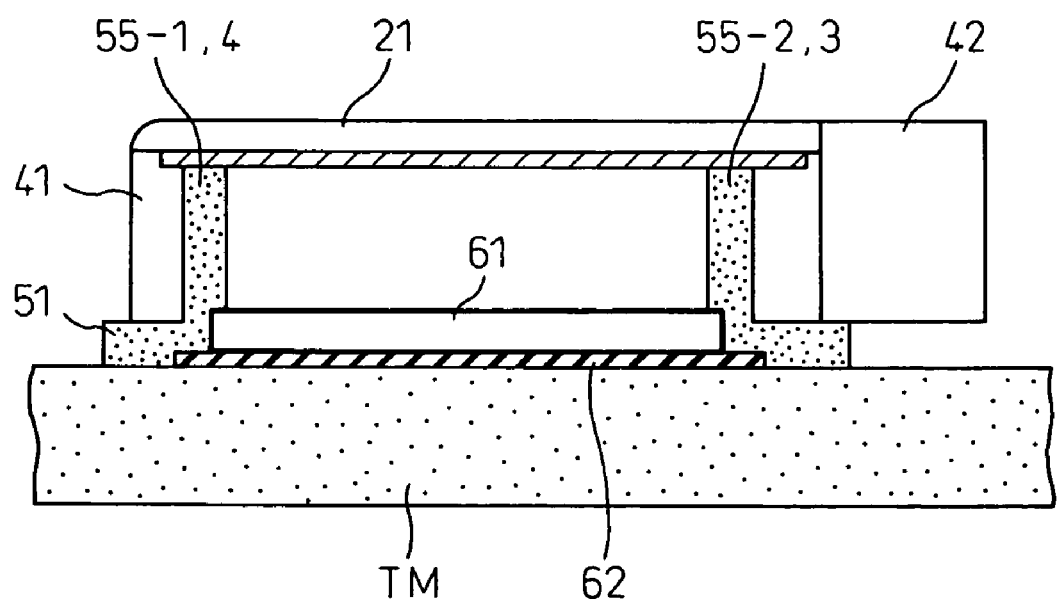
FIG. 5 is a view illustrating a state where the electronic control device is mounted on the wall of a transmission.

Though not illustrated in FIG. 5, the electronic control device is attached at the mounting protrusions 52 of the mounting plate 51 to the wall TM of the transmission by using screws. As a result, the metal substrate 62 forming a plane in flush with the lower surface of the mounting plate 51 comes into direct contact over the whole surface thereof with the wall TM of the transmission. Heat generated from the power parts contained in the power module 61 is transmitted to the metal substrate 62 and is radiated to the transmission TM through the metal substrate 62.

The temperature of the transmission TM is about 110° C. when the automobile is traveling normally due to the circulation of the oil. Even under a high load condition, the temperature is maintained at about 130° C. From the standpoint of the designed heat resistance of the electronic parts, the above temperature is not high enough to destroy the elements.

In order to positively employ a constant-temperature control by the circulation of oil, it can be contrived to constitute a passage in the wall TM of the transmission such that the circulating oil comes into direct contact with the metal substrate 62 to thereby absorb heat from the metal substrate 62.

Figure 6:
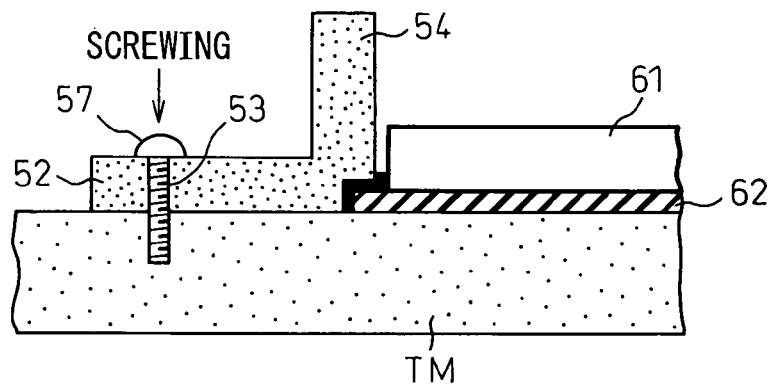
FIG. 6 is a view illustrating, partly on an enlarged scale, a relationship between a metal substrate and a mounting plate of when the electronic control device is mounted on the transmission wall.

Next, FIG. 6 is a view illustrating, partly on an enlarged scale, a relationship between the metal substrate and the mounting plate of when the electronic control device is mounted on the wall of the transmission. In FIG. 6, too, portions the same as those of FIG. 1 are denoted by the same reference numerals.

In FIG. 6, the electronic control device is mounted on the wall TM of the transmission by using fixing screws 57 passing through the mounting holes formed in the mounting protrusions 52 of the mounting plate 51. There is illustrated a state where the mounting plate 51 and the metal substrate 62 are intimately adhered to the flat surface of the wall TM of the transmission.

However, the surface of the wall TM of the transmission is not necessarily flat entirely but is rough to some extent. When the electronic control device is secured by screws to such a place so as to withstand the vibration of the automobile, however, the electronic control device is affected by the roughness of the wall TM of the transmission if the inner peripheral edges of the opening of the mounting plate 51 and the outer peripheral edges of the metal substrate 62 are in a state of being secured together. Then, stress concentrates in the outer peripheral edges, and the metal substrate 62 warps. The metal substrate 62 in this state is not favorably contacted to the wall TM of the transmission and, besides, the adhesion between the metal substrate 62 and the power module 61 becomes defective. As a result, the heat radiating performance is deteriorated.

To avoid this, therefore, a gap is formed between the inner peripheral edges of the opening of the mounting plate 51 and the outer peripheral edges of the metal substrate 62 as shown in FIG. 6, and is filled with an elastic silicone or rubber adhesive 67 to adhere the two together in advance. In this state, the electronic control device is mounted on the wall TM of the transmission. Then, even when the mounting plate 51 is firmly secured to the wall TM of the transmission by using fixing screws 57, stress is absorbed by the elasticity of the elastic adhesive agent 67, despite the roughness. The metal substrate 62 does not warp to prevent defective heat conduction or peeling of the module.

In the structure for mounting the electronic control device on the wall TM of the transmission illustrated in FIG. 1, however, the mounting plate 51 and the mounting protrusions 52 are forming the same plane. Therefore, if it is attempted to mount the electronic control device on the wall TM of the transmission in a manner that it will not be detached by the vibration of the automobile, then, a large force acts due to the fixing screws in a direction at right angles with the wall. Therefore, the wall that is rugged inevitably exerts an excessive force on the metal substrate 62.

Figure 7:
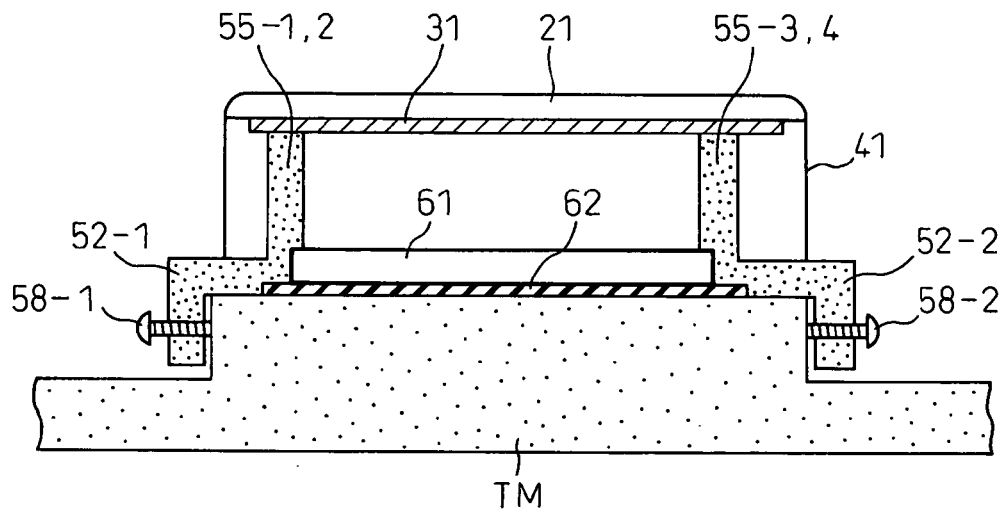
FIG. 7 is a view illustrating another state where the electronic control device is mounted on the wall of the transmission.

Namely, this stems from the mounting plate 51 and the mounting protrusions 52 being formed on the same plane. Referring to FIG. 7, therefore, the mounting plate 51 and the mounting protrusions 52 are arranged to be at right angles to each other, and the direction of force produced by the fixing screws 58-1 and 58-2 at the time of mounting is oriented to be in parallel with the metal substrate 62. To cope with this, a stepped portion is formed on the wall of the transmission at the mounting portion as illustrated in FIG. 7. On the mounting plate 51, there are provided mounting protrusions 52-1 and 52-2 in a form to hold the stepped portion.

By holding the stepped portion of the wall TM of the transmission by the mounting protrusions 58-1 and 58-2, no excess of force acts on the metal substrate 62 even when the electronic control device is mounted by fastening the fixing screws 58-1 and 58-2 in the opposite directions relative to each other. The lower surface of the metal substrate 62 comes in contact with the upper surface of the stepped portion of the wall TM of the transmission, i.e., comes in contact with the upper surface of the stepped portion in a manner to overcome the roughness that may exist in the upper surface of the stepped portion.

Even without forming the stepped portion on the wall TM of the transmission, the two mounting protrusions may be so formed as to hold a portion of the body of the transmission.

Radiating the heat of the electronic parts on the control circuit substrate.

The printed wiring of the electronic circuit formed on the control circuit substrate 31 is electrically connected to the lead wires on the upper surface of the control circuit substrate 31. Therefore, the electronic parts constituting the electronic circuit are mounted on the lower surface of the control circuit substrate 31. Heat generated by the electronic parts and, particularly, the CPUs must be radiated, as much as possible, when they are used in a high-temperature environment such as in an engine compartment. In order to radiate the heat of the electronic parts, the belt like heat-conducting member 56 is integrally formed spanning across the square frame member 54 as shown in FIG. 1.

Figure 8:
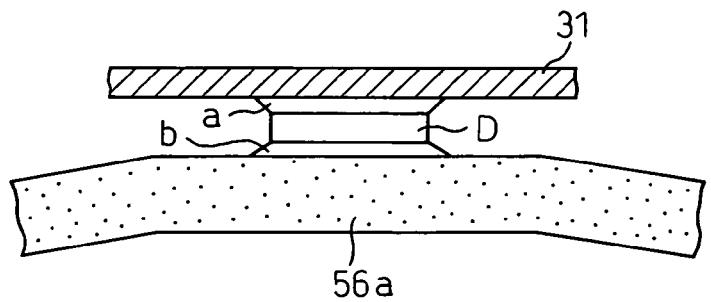
FIG. 8 is a view illustrating a concrete example of radiation of heat of the electronic parts mounted on the control circuit substrate in the electronic control device.

FIG. 8 is a view illustrating, on an enlarged scale, a contact portion between the electronic part and the belt like heat-conducting member 56. FIG. 8 illustrates a case where the electronic part is in contact with the belt like heat-conducting contact member 56a which is one step higher than the belt like heat-conducting member 56.

An electronic part D such as a semiconductor chip is mounted on the lower surface of the control circuit substrate 31 having no heat-radiating function by a solder or a lead a. The electronic part D is in contact with the upper surface of the belt like heat-conducting contact member 56a via an elastic adhesive b. The elastic adhesive b is a good heat-conducting material, such as a silicone or rubber adhesive. The elastic adhesive b is interposed between the electronic part d and the belt like heat-conducting contact member 56a. This reduces the effect of vibration when the vehicle is traveling and, further, reduces the thermal stress.

Figure 9:
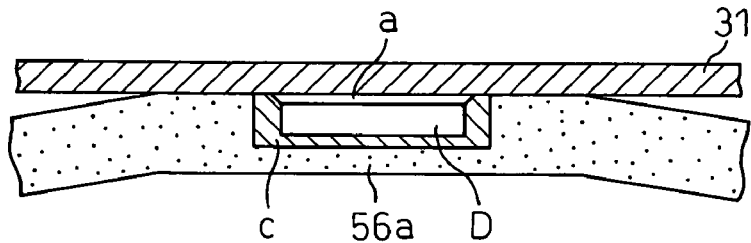
FIG. 9 is a view illustrating another concrete example of radiation of heat of the electronic parts mounted on the control circuit substrate in the electronic control device.

The heat-radiating efficiency of the electronic part D can be improved by bringing the belt like heat-conducting contact member 56a into thermal contact with the electronic part D. FIG. 9 illustrates a modified example for further improving the heat-radiating efficiency by utilizing the belt like heat-conducting contact member 56a. The state of radiating the heat of FIG. 9 is the same as the case of FIG. 8, but in which a recessed portion is formed in the belt like heat-conducting contact member 56a to accommodate the electronic part D, and a gap formed relative to the electronic part D in the recessed portion is filled with a gelatinous substance having good heat conductivity. By being filled with the gelatinous substance, heat of the electronic part D is more efficiently radiated.

The belt like heat-conducting member 56 described above was formed integrally with the square frame member 54 by die-casting. The belt like heat-conducting member 56 is formed spanning across the walls of the square frame member 54, and requires a complex metal mold for die-casting further affecting the arrangement of the lead conductors. Besides, heat conduction of the die cast is inferior to that of copper, and limitation is imposed on radiating the heat of the electronic parts.

Figure 10:
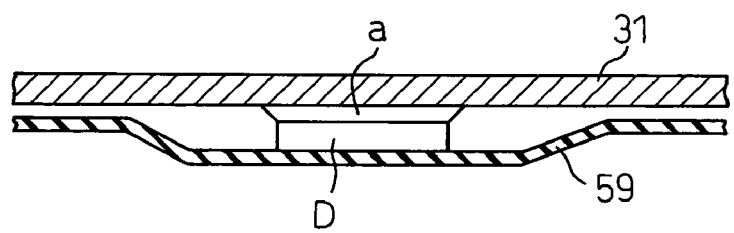
FIG. 10 is a view illustrating a further concrete example of radiation of heat of the electronic parts mounted on the control circuit substrate in the electronic control device.

Instead of using the belt like heat-conducting member 56 that is integrally molded, therefore, there is used a heat-conducting metal plate 59 made of copper that is separately formed as shown in FIG. 10. The metal plate 59 is provided with a recessed portion that is formed by draw working to accommodate the electronic part D as well as to reinforce the strength. In mounting the control substrate 31 on the support members 55-1 to 55-4, the metal plate 59 is secured being held between the control circuit substrate 31 and the support members 55-1 to 55-4. Upon securing the metal plate 59, the surface of the electronic part D comes into contact with the recessed metallic portion; i.e., heat of the electronic part D is efficiently collected and is transmitted to the support members and heat of the electronic part D is radiated in an improved manner.

Modified example of contact between the metal substrate and the wall of the transmission.

The metal substrate for radiating heat provided in the electronic control device nit of FIG. 1 is so constituted that the flat surface of the whole plate is simply brought into direct contact with the wall of the transmission. As illustrated in FIGS. 5 to 7, further, the stress is relaxed and heat is radiated while the contact surface of the metal substrate remains flat. Described below is a structure with which when the electronic control device is mounted on the wall of the transmission, stress is prevented from occurring in the metal substrate in the up-and-down direction or is reduced, or a heat-radiating passage from the metal substrate is maintained.

Figure 11:
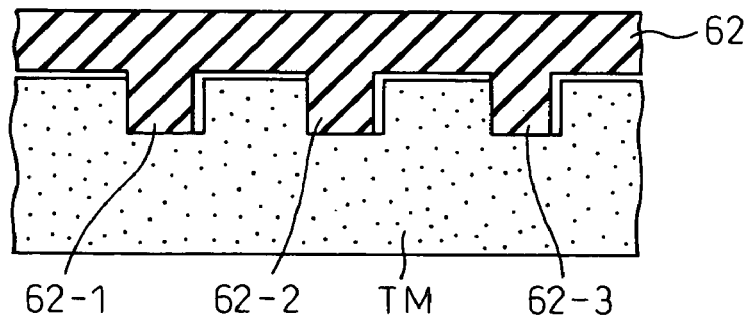
FIG. 11 is a view illustrating a first concrete structure for mounting a metal substrate of the electronic control device on the wall of the transmission.

FIG. 11 illustrates a first concrete structure for mounting the metal substrate of the electronic control unit on the wall of the transmission. The structure for mounting the electronic control device illustrated in FIG. 11 has stepped portions for mounting on the wall TM of the transmission as illustrated in FIG. 7. The mounting plate 51 and the mounting protrusions 52 are arranged at right angles, and the mounting force is produced by the fixing screws 58-1 and 58-2 in a direction in parallel with the metal substrate 62 to obtain improved effect. FIG. 11 illustrates, on an enlarged scale, only a portion where the metal substrate is brought into contact with the wall of the transmission. Other elements of the electronic control device are not illustrated to simplify the drawing.

On the lower surface of the metal substrate 62, there are formed a plurality of protrusions 62-1 to 62-3 having a rectangular sectional shape in a direction at right angles to the direction of the mounting force. In the upper surface of the stepped portion of the wall TM of the transmission, there are formed recessed portions of a rectangular shape in cross section in parallel with the protrusions on the lower surface of the metal substrate in agreement with the gap of arrangement thereof.

As illustrated in FIG. 11, therefore, in mounting the electronic control device, the protrusions formed on the lower surface of the metal substrate 62 are fitted into the recessed portions in the wall TM of the transmission and are, then, fastened by using the fixing screws 58-1 and 58-2. Then, the side surfaces on one side of the protrusions of the metal substrate 62 are brought into pressed contact with the inner side surfaces of either side in the recessed portions in the wall TM of the transmission.

The wall of the transmission is usually rough due to the casting mold and does not always necessarily provide satisfactory surface contact to the metal substrate. However, formation of the flat press-contacting surface based on the above-mentioned structure makes it possible to accomplish the mounting without exerting the force on the metal substrate 62 in the up-and-down direction yet maintaining the heat-radiating passage of the metal substrate 62 due to the press-contact of the side surfaces.

The recessed portions and protrusions may have such rectangular shapes in cross section that at least the side surfaces of either side are brought into pressed contact when the fixing screws are tightened though their sizes may not be in agreement with each other. The number of sets of the recessed portions and protrusions is suitably selected depending upon the degree of heat. The effect is obtained to a sufficient degree even when the height of the protrusions is smaller than the length of the fins of the heat sink used in the conventional electronic control devices.

Figure 12:
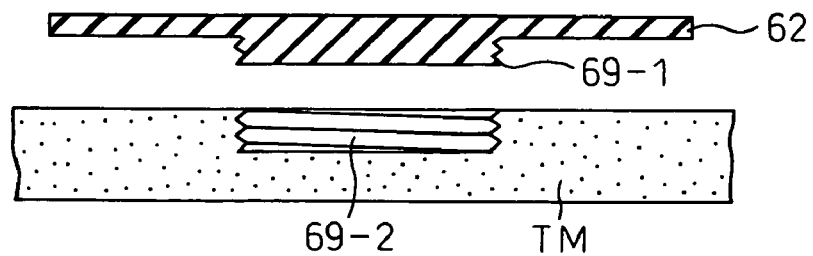
FIG. 12 is a view illustrating a second concrete structure for mounting the metal substrate of the electronic control device on the wall of the transmission.

Next, FIG. 12 illustrates a second concrete structure for mounting the metal substrate of the electronic control device on the wall of the transmission. In the first concrete structure illustrated in FIG. 11, a plurality of protrusions are formed on the metal substrate 62 and are brought into engagement with the recessed portions in the wall TM of the transmission. The heat-radiating passage is maintained as the side surface of the recessed portions and protrusions are press-contacted to each other without exerting the force in the up-and-down direction. In the second concrete constitution, the metal substrate 62 and the wall TM of the transmission have threaded portions and are secured together.

FIG. 12 illustrates, on an enlarged scale, only a portion where the metal substrate is brought into contact with the wall of the transmission. Other elements of the electronic control device are not illustrated to simplify the drawing. An externally threaded portion 69-1 is formed on the metal substrate 62 and integral therewith. An internally threaded portion 69-2 is formed in the wall TM of the transmission so as to be engaged with the threaded portion 69-1.

In mounting the electronic control unit device, the threaded portion 69-1 of the metal substrate 62 is brought into engagement with the threaded portion 69-2 in the wall TM of the transmission; i.e., the metal substrate 62 is intimately secured to the wall TM of the transmission. Thereafter, the body of the electronic control device is mounted and, at this moment, the power module 61 and the metal substrate 62 are thermally joined together.

In the second concrete structure, the engaging surfaces form a heat-radiating passage due to the engagement of the threaded portions 69-1 and 69-2, i.e., maintain the heat-radiating passage of the metal substrate 62. In this engagement, the metal substrate 62 does not receive the force in the up-and-down direction and is not warped. In mounting the electronic control unit relying upon this constitution, the power module 61 and the metal substrate 62 must be adhered together with a heat-conducting adhesive. When mounted on the flat surface of the wall TM of the transmission as illustrated in FIG. 5, this structure can also be mounted on the stepped portion of the wall TM of the transmission as illustrated in FIG. 7.

Figure 13:
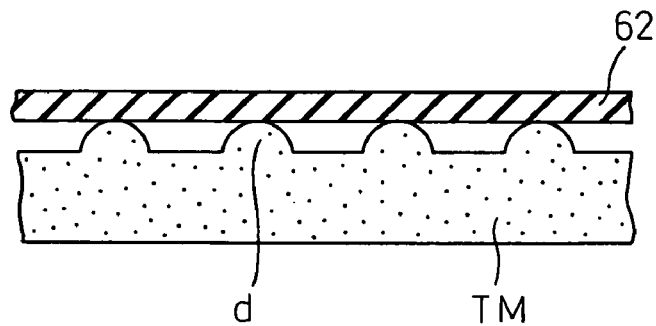
FIG. 13 is a view illustrating a third concrete structure for mounting the metal substrate of the electronic control device on the wall of the transmission.

Next, FIG. 13 illustrates a third concrete structure for mounting the metal substrate of the electronic control device on the wall of the transmission. In the third concrete constitution, the lower surface of the metal substrate 62 remains flat, and protrusions are formed on the wall of the transmission to maintain a heat-radiating passage of the metal substrate. FIG. 13 illustrates, on an enlarged scale, only a portion where the metal substrate is contacted to the wall of the transmission, but does not illustrate other elements of the electronic control device to simplify the drawing.

Referring to FIG. 13, the surface of the wall TM of the transmission is machined to form a plurality of semispherical protuberances d which have the same height to form a plane. The protuberances d may be rivets or screws.

According to the third concrete constitution, when the electronic control device is mounted, the lower surface of the metal substrate 62 is intimately adhered to a plurality of protuberances d on the wall TM of the transmission. Namely, the protuberances form heat-radiating passages, and the heat of the metal substrate 62 is radiated to the wall TM of the transmission.

Figure 14:
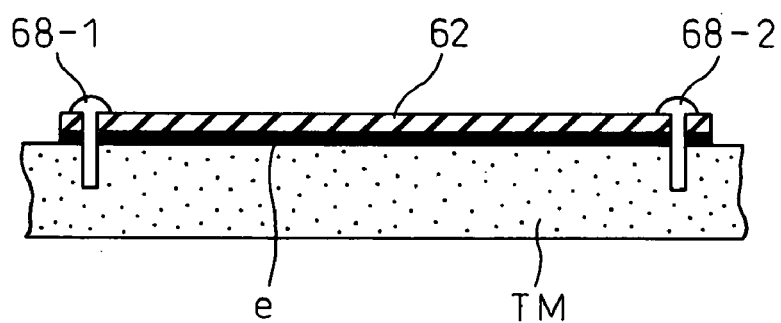
FIG. 14 is a view illustrating a fourth concrete structure for mounting the metal substrate of the electronic control device on the wall of the transmission.

Next, FIG. 14 illustrates a fourth concrete structure for mounting the metal substrate of the electronic control device on the wall of the transmission. FIG. 14 illustrates, on an enlarged scale, only a portion where the metal substrate is contacted to the wall of the transmission, but does not illustrate other elements of the mounted electronic control device to simplify the drawing.

In the fourth concrete structure, a sheet of heat-conducting silicone or rubber for forming an elastic layer is interposed while the metal substrate 62 is contacted to the wall TM of the transmission. In FIG. 14, the metal substrate 62 is mounted by using fixing screws 68-1 and 68-2 while interposing the elastic sheet e relative to the wall TM of the transmission. With the elastic sheet e being interposed, the intimacy of adhesion is improved despite the mounting surface of the wall TM of the transmission being rough. Therefore, heat is favorably radiated, stress at the time of mounting is absorbed, and the metal substrate 62 is not at all affected.

In FIG. 14, the metal substrate 62 is mounted on the wall TM of the transmission by using fixing screws. When the electronic control device is mounted on the flat surface of the wall TM of the transmission as illustrated in FIG. 5, too, it is allowable to interpose the elastic sheet e between the metal substrate and the wall TM of the transmission.

Figure 15:
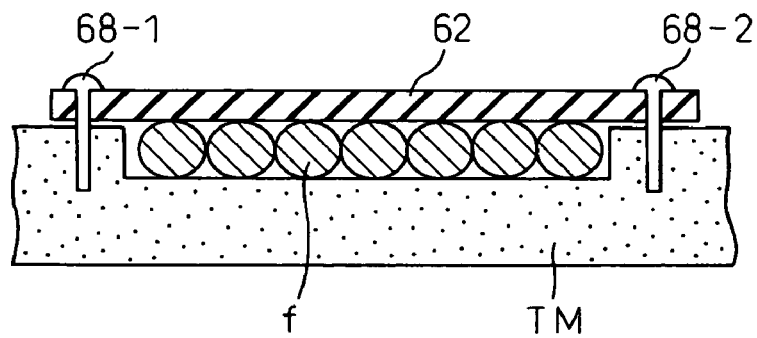
FIG. 15 is a view illustrating a fifth concrete structure for mounting the metal substrate of the electronic control device on the wall of the transmission.

Next, FIG. 15 illustrates a fifth concrete structure for mounting the metal substrate of the electronic control device on the wall of the transmission. In the fifth concrete constitution, a heat-conducting elastic member is interposed between the metal substrate and the wall TM of the transmission as in the fourth concrete constitution illustrated in FIG. 14. Here, the heat-conducting elastic member is realized by the heat-conducting elastic balls f instead of using the elastic sheet e.

In the concrete constitution of FIG. 5, a recessed portion is formed in the wall TM of the transmission at the mounting position, the recessed portion being shallower than the diameter of the elastic balls f. In mounting the electronic control device on the wall TM of the transmission, the elastic balls f are arranged in the recessed portion formed in the wall TM of the transmission.

The metal substrate is mounted on the wall TM of the transmission by using the fixing screws 68-1 and 68-2 in a manner to cover the elastic balls f with the metal substrate 62. Here, the elastic balls f are depressed as the metal substrate 62 is fastened to the wall TM of the transmission by using the fixing screws 68-1 and 68-2. As a result, the adhesion is improved between the metal substrate 62 and the recessed portion in the wall TM of the transmission.

Instead of arranging the elastic balls in the recessed portion formed in the wall TM of the transmission which is employed by the fifth concrete structure, it is also possible to stick a predetermined number of the elastic balls f onto the surface of the wall TM of the transmission that is illustrated in FIG. 5. When the electronic control device is mounted on the wall TM of the transmission, the elastic balls f are depressed between the metal substrate 62 and the wall TM of the transmission. Even by this method, the intimacy of adhesion is improved between the metal substrate 62 and the recessed portion in the wall TM of the transmission, and the heat-radiating passage is maintained while relaxing the stress in the up-and-down direction.

According to the electronic control device of the present invention as described above, the control circuit board is supported by a mounting plate made of a die cast mounted on the wall of the transmission of, for example, an automobile, and a belt like heat-conducting member extending from the mounting plate is brought into contact with the electronic parts mounted on the control circuit substrate. For example, even when the control circuit board generates a heat of not smaller than 1 W, the heat resistance can be decreased down to not larger than 5° C./W in contrast with the heat resistance of 20° C./W of the conventional electronic control devices in which heat was radiated through the resin substrate only. Therefore, even when installed in a high-temperature environment where a temperature margin is small such as in an engine compartment of an automobile, the heat can be radiated to a sufficient degree by using a resin substrate as the control board.

In the electronic control device of the present invention, further, the control circuit board and the power module are arranged in an opposing manner in the casing in which the connectors for external connection are integrally formed on one side surface thereof. Owing to this arrangement, a plurality of lead conductors extending from the power module and a plurality of lead conductors extending from the connectors are electrically connected together on the control circuit board. This makes it possible to decrease the size of the casing of the electronic control device. Besides, the surface mounting is realized enabling the electric connection to be accomplished on one surface of the control circuit board, and the operation efficiency for electric connection is improved. Besides, the electronic control device as a whole can be assembled easily and automatically.

With the electronic control device of the present invention, further, the metal substrate mounting power parts that generate heat in large amounts are brought into contact, directly or via a heat-conducting elastic member, with the external heat-radiating body of which the temperature has been controlled to remain constant, such as the transmission of an automobile. This makes it possible to eliminate the heat sink which is large in size and to decrease the size of the device as well as the cost of the parts.

In the electronic control device of the present invention, a heat-conducting elastic member is interposed between the mounting plate of the unit and the metal substrate or between the metal substrate and the wall of the transmission. When the electronic control device is mounted, therefore, the metal substrate is adhered more intimately maintaining heat-radiating passage and relaxing the stress exerted on the metal substrate in the up-and-down direction.

In the electronic control device of the present invention, further, protrusions, recessed portions or treaded portions are formed in the metal substrate or in the wall of the transmission. When the electronic control device is mounted, therefore, the stress in the metal substrate is reduced and a heat-conducting passage is maintained without being affected by the roughness of the surface of the wall of the transmission.

In the electronic control device of the invention, the screws are tightened in a direction in parallel with the metal substrate at the time of mounting the electronic control device. In mounting the electronic control device, therefore, no stress acts on the metal substrate, in the up-and-down direction.

What is claimed is:

1. An electronic control device comprising:
    a control circuit substrate forming an electronic circuit inclusive of electronic parts;
    a casing containing therein said control circuit substrate and having connectors for external connection thereof;
    a metallic mounting plate having, and integrally formed together therewith, an external mounting portion and a frame-like fitting member in which a plurality of support portions for supporting said control circuit substrate are erected surrounding the opening in the bottom surface; and
    a power circuit substrate which includes a metallic substrate and is fitted to the opening in said bottom surface, forming a drive circuit inclusive of power control elements electrically connected to said electronic circuit, and exposing the lower surface of the metallic substrate.

2. An electronic control device according to claim 1, wherein when said power circuit substrate is fitted to the opening in said bottom surface, there is formed a mounting surface and the mounting portion, the frame-like fitting member, and the lower surface of said power circuit substrate are on the same plane.

3. An electronic control device according to claim 2, wherein said mounting plate is mounted on an external heat-absorbing member by said external mounting portion, and said mounting surface is brought into contact with the surface of said external heat-absorbing member.

4. An electronic control device according to claim 1, wherein said control circuit substrate is a heat-resistant resin substrate, and a space is formed by said support portion relative to said power circuit substrate.

5. An electronic control device according to claim 4, wherein said electronic parts are connected to the lower surface of said control circuit substrate.

6. An electronic control device according to claim 5, wherein a heat-radiating portion is provided in said space to radiate the heat of said electronic parts to said mounting plate.

7. An electronic control device according to claim 6, wherein said heat-radiating portion is made of a metal plate which is supported by said support portion so as to come in contact with said electronic parts.

8. An electronic control device according to claim 6, wherein
    said heat-radiating portion has a belt-like heat conducting member arranged in said space, said belt-like heat conducting member being continuously formed integrally with said frame-like fitting member so as to come in contact with said electronic parts.

9. An electronic control device according to claim 8, wherein a heat conducting and elastic adhesive layer is interposed between said electronic parts and said belt-like heat conducting member.

10. An electronic control device according to claim 8, wherein said belt-like heat conducting member has a recessed portion for accommodating said electronic parts, and said recessed portion is filled with a heat conducting gelatinous material.

11. An electronic control device according to claim 4, wherein the ends of a plurality of lead conductors extending from said connectors for external connection and the ends of a plurality of lead conductors extending from said power circuit substrate, protrude beyond the side surface opposite to said power circuit substrate through the lead conductor holes formed in said control circuit substrate so as to be connected to said electronic circuit formed on said control circuit substrate.

12. An electronic control device according to claim 4, wherein a socket or a plug connected to said power circuit is disposed on the upper surface of said power circuit substrate, and a plug or a socket to be connected to said electronic circuit is disposed on the lower surface of said control circuit substrate by being engaged with said socket or the plug.

13. An electronic control device according to claim 12, wherein said socket and said plug have surface contact portions that slide in one direction relative to each other.

14. An electronic control device according to claim 1, wherein said power circuit substrate is fitted to said frame-like fitting member in the inner peripheral portion of the opening in said bottom surface by using a heat conducting and elastic adhesive.

15. An electronic control device according to claim 3, wherein said external mounting portion has a fastening portion for fastening and securing said external heat-absorbing member.

16. An electronic control device according to claim 15, wherein said fastening portion has at least two protruding portions integrally formed with said mounting plate in a direction at right angles with said mounting surface, and tightening screws that fit to the protruding portions.

17. An electronic control device according to claim 3, wherein said power circuit substrate has engaging protrusions corresponding to engaging recessed portions formed in the surface of said external heat-absorbing member, and the engaging recessed portions and the engaging protrusions are press-contacted in the direction of said mounting surface due to the fastening force produced by said fastening screws.

18. An electronic control device according to claim 3, wherein said power circuit substrate has a threaded engaging portion that protrudes from the bottom surface of said substrate, and said threaded engaging portion is screwed into said external heat-absorbing member so that said power circuit substrate is intimately adhered onto said external heat-absorbing member.

19. An electronic control device according to claim 3, wherein said power circuit substrate is screwed into said external heat-absorbing member with a heat conducting elastic layer interposed therebetween.

20. An electronic control device according to claim 3, wherein said power circuit substrate is secured upon coming in contact with a plurality of protrusions formed on the surface of said external heat-absorbing member.

21. An electronic control device according to claim 3, wherein said power circuit substrate is secured to said external heat-absorbing member via heat conducting elastic balls arranged in a groove formed in said external heat-absorbing member.

22. An electronic control device according to claim 3, wherein said external heat-absorbing member is a housing of a transmission of an automobile.

23. An electronic control device according to claim 3, wherein said power circuit substrate is cooled by a lubricating oil in the transmission housing of an automobile.

* * * * *